United States Patent
Shim et al.

(10) Patent No.: US 9,214,202 B2
(45) Date of Patent: Dec. 15, 2015

(54) INPUT BUFFER AND MEMORY DEVICE INCLUDING THE SAME

(71) Applicant: Samsung Electronics Co., Ltd., Suwon-si (KR)

(72) Inventors: Yong Shim, Suwon-si (KR); Seung-Jun Bae, Hwaseong-si (KR); Won-Joo Yun, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/644,339

(22) Filed: Mar. 11, 2015

(65) Prior Publication Data

US 2015/0325274 A1 Nov. 12, 2015

(30) Foreign Application Priority Data

May 12, 2014 (KR) .................. 10-2014-0056366

(51) Int. Cl.
G11C 16/04 (2006.01)
G11C 7/10 (2006.01)

(52) U.S. Cl.
CPC ............ *G11C 7/1084* (2013.01); *G11C 7/1054* (2013.01)

(58) Field of Classification Search
CPC ....... G11C 7/1051; G11C 7/1078; G11C 7/22
USPC .............. 365/189.05, 189.08, 189.11, 189.12
IPC ................................ G11C 7/1051, 7/1078, 7/22
See application file for complete search history.

(56) References Cited

U.S. PATENT DOCUMENTS

| | | | |
|---|---|---|---|
| 6,114,872 A | 9/2000 | Takahashi | |
| 6,480,039 B1 | 11/2002 | Feurle | |
| 6,529,993 B1 * | 3/2003 | Rogers | G11C 7/1051 365/189.02 |
| 6,750,684 B2 | 6/2004 | Lim | |
| 6,891,763 B1 | 5/2005 | Han | |
| 7,737,729 B2 | 6/2010 | Dimitriu | |
| 7,778,097 B2 | 8/2010 | Chung et al. | |
| 2003/0235105 A1 * | 12/2003 | Kobayashi | G11C 7/1072 365/230.08 |
| 2005/0231233 A1 | 10/2005 | Kasai et al. | |

FOREIGN PATENT DOCUMENTS

| | | |
|---|---|---|
| JP | 2004-015714 A | 1/2004 |
| KR | 1999-0039622 A | 6/1999 |
| KR | 2009-0098296 A | 9/2009 |

* cited by examiner

*Primary Examiner* — Connie Yoha
(74) *Attorney, Agent, or Firm* — Muir Patent Law, PLLC

(57) ABSTRACT

An input buffer includes a first buffer, a feedback circuit and a second buffer circuit. The feedback circuit includes a feedback resistor and a feedback inverter. The first buffer may be configured to output an amplification signal to an output node of the first buffer based on an input signal. The feedback circuit connected to the output node of the first buffer may be configured to control the amplification signal. The second buffer circuit may be configured to output a buffer output signal by buffering the amplification signal. The feedback resistor may receive the amplification signal from the output node of the first buffer and provide a feedback signal to a feedback node. The feedback inverter is connected between the feedback node and the output node. The feedback inverter may be configured to control the amplification signal based on the feedback signal.

20 Claims, 16 Drawing Sheets

INPUT BUFFER AND MEMORY DEVICE INCLUDING THE SAME

CROSS-REFERENCE TO RELATED APPLICATION

This application claims priority under 35 USC §119 to Korean Patent Application No. 10-2014-0056366, filed on May 12, 2014 in the Korean Intellectual Property Office (KIPO), the contents of which are herein incorporated by reference in their entirety.

BACKGROUND

1. Technical Field

Example embodiments relate generally to a semiconductor integrated circuit and more particularly to an input buffer and a memory device including the input buffer.

2. Description of the Related Art

An input buffer may be used to temporarily store data and to compensate a difference of data transmission speed while the data is transmitted from one device to another device.

According to development of technology related to an electronic device, memory devices are being developed to have higher performance. For higher performance of a memory device, an input buffer having high operation speed is typically required.

SUMMARY

Some example embodiments provide an input buffer capable of increasing performance by preventing a decrease of amplitude of a signal caused by a feedback circuit included in the input buffer.

Some example embodiments provide a memory device capable of increasing performance by preventing a decrease of amplitude of a signal caused by a feedback circuit included in an input buffer.

According to example embodiments, an input buffer includes a first buffer, a feedback circuit and a second buffer circuit. The feedback circuit includes a feedback resistor and a feedback inverter. The first buffer outputs an amplification signal to an output node of the first buffer based on a first input signal. The feedback circuit connected to the output node of the first buffer controls the amplification signal. The second buffer circuit outputs a buffer output signal by buffering the amplification signal. The feedback resistor receives the amplification signal from the output node of the first buffer and provides a feedback signal to a feedback node. The feedback inverter is connected between the feedback node and the output node. The feedback inverter controls the amplification signal based on the feedback signal. The output node of the first buffer and an output node of the feedback inverter are the same node.

The feedback resistor may include a variable resistor. A resistance of the variable resistor may be adjustable.

The variable resistor may include a plurality of resistors and a plurality of resistor switches. The plurality of resistors may be connected in series or parallel. When the plurality of resistors are connected in series, each of the plurality of resistor switches may be connected to a respective resistor in parallel. When the plurality of resistors are connected in parallel, each of the plurality of resistor switches may be connected to a respective resistor in series.

A logic threshold voltage of the feedback inverter may be adjustable.

The logic threshold voltage of the feedback inverter may be substantially equal to a logic threshold voltage of a first inverter included in the second buffer circuit.

The feedback inverter may include a plurality of P-MOS transistors, a plurality of N-MOS transistors and a plurality of transistor switches. The plurality of P-MOS transistors may be connected to a power supply voltage. The plurality of N-MOS transistors may be connected to a ground voltage. The plurality of transistor switches may connect each of the plurality of P-MOS transistors and the plurality of N-MOS transistors to the output node of the first buffer.

The plurality of transistor switches may be independently controlled based on respective control signals provided from outside of the input buffer.

The logic threshold voltage of the feedback inverter may be adjustable by controlling each of the plurality of P-MOS transistors and the plurality of N-MOS transistors based on the control signals.

The first buffer may be turned on or turned off based on an enable signal provided from outside of the input buffer.

When the first buffer is turned off based on the enable signal, the plurality of resistor switches included in the feedback circuit may be turned off.

In a case where the first buffer is turned off based on the enable signal, the plurality of transistor switches included in the feedback circuit may be turned off.

The feedback circuit may further comprise a feedback switch connected between the feedback resistor and the feedback inverter. In a case where the first buffer is turned off based on the enable signal, the feedback switch may be turned off.

The first buffer may be configured to output the amplification signal to the output node of the first buffer based on additional a second input signal having an opposite phase of the first input signal.

According to example embodiments, a memory device includes an input buffer and a memory cell array. The input buffer includes a first buffer, a feedback circuit and a second buffer circuit. The input buffer outputs a buffer output signal based on an input signal. The memory cell array may be configured to store data corresponding to the buffer output signal. The feedback circuit includes a feedback resistor and a feedback inverter. The first buffer outputs an amplification signal to an output node of the first buffer based on the input signal. The feedback circuit connected to the output node of the first buffer controls the amplification signal. The second buffer circuit outputs the buffer output signal by buffering the amplification signal. The feedback resistor receives the amplification signal from the output node of the first buffer and provides a feedback signal to a feedback node. The feedback inverter is connected between the feedback node and the output node of the first buffer. The feedback inverter controls the amplification signal based on the feedback signal. An input node of the feedback inverter is the same as the feedback node.

According to example embodiments, a circuit for a semiconductor device is provided. The circuit includes a first buffer, a second buffer, a resistor, and a third buffer. The first buffer includes a first input node and an output node, and is configured to output a first output signal on the output node in response to a first input signal on the first input node. The second buffer includes an input node and an output node, and is configured to output a second output signal on the output node of the second buffer in response to the first output signal. The resistor includes a first end connected to the output node of the first buffer and a second end connected to the input node of the second buffer. The third buffer including an input node and an output node, and configured to output a third output signal on the output node of the third buffer in response to the first and second output signals.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
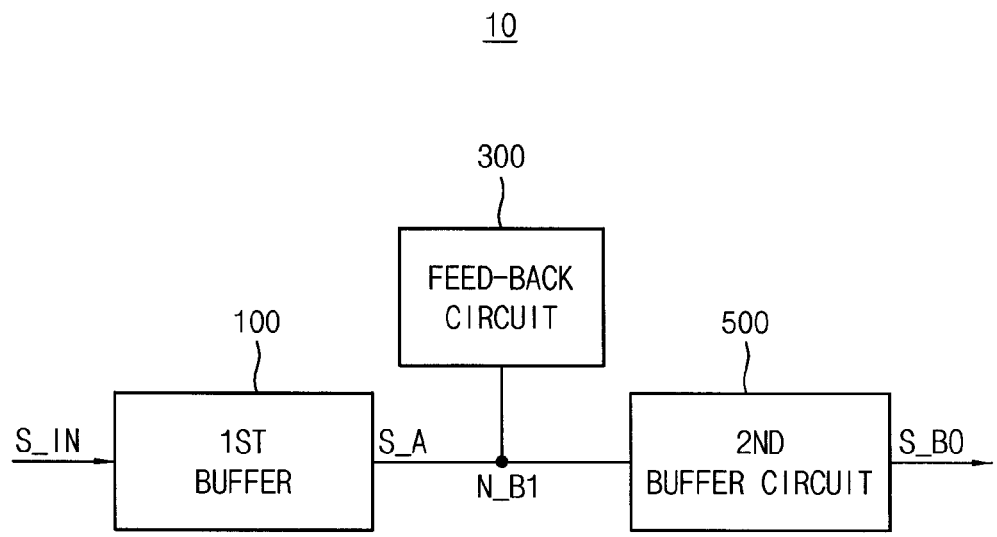
FIG. 1 is a block diagram illustrating an input buffer according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are only used to distinguish one element from another. Thus, a first element discussed below could be termed a second element without departing from the teachings of the present inventive concept. As used herein, the term "and/or" includes any and all combinations of one or more of the associated listed items. Expressions such as "at least one of," when preceding a list of elements, modify the entire list of elements and do not modify the individual elements of the list.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements present. Other words used to describe the relationship between elements should be interpreted in a like fashion (e.g., "between" versus "directly between,""adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprise," "comprising," "include," and/or "including," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
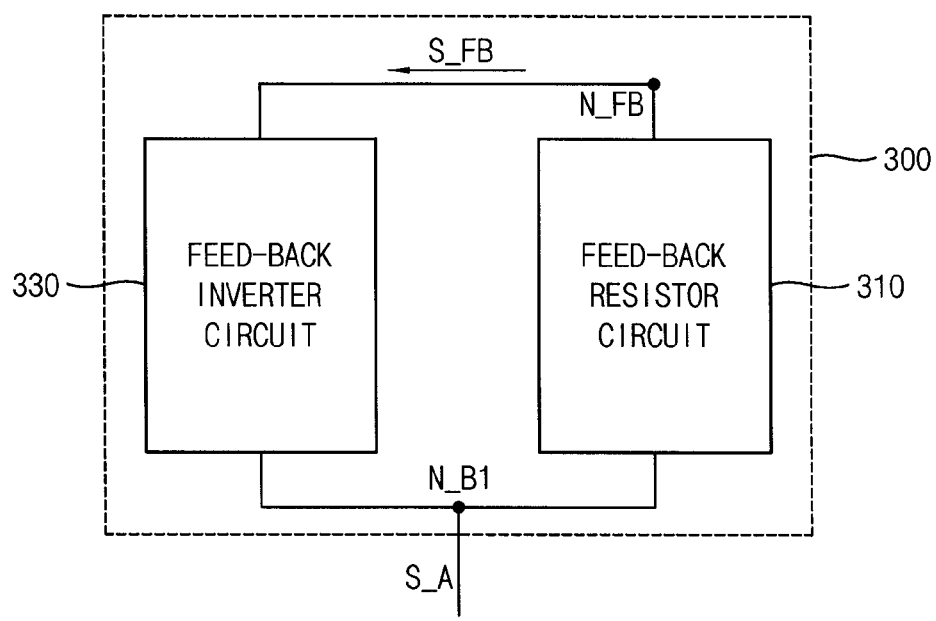
FIG. 2 is a block diagram illustrating a feedback circuit included in the input buffer of FIG. 1 according to example embodiments.

FIG. 1 is a block diagram illustrating an input buffer according to example embodiments and FIG. 2 is a block diagram illustrating a feedback circuit included in the input buffer of FIG. 1 according to example embodiments.

Referring to FIGS. 1 and 2, an input buffer (or an input circuit) 10 includes a first buffer 100, a feedback circuit 300 and a second buffer circuit 500. The input buffer may be part of a semiconductor device. As used herein, a semiconductor device may refer to various items such as a memory device, a semiconductor chip, a memory chip, a logic chip, a package, or combinations thereof. A semiconductor device such as a semiconductor chip, a memory chip, or a logic chip may be formed from a wafer. A semiconductor device may include one or more chips stacked on a package substrate, or a package-on-package device including a plurality of packages. An electronic device, as used herein, may refer to one of these devices and may also include products that include these devices, such as a memory module, a memory card, a hard drive including additional components, a mobile phone, laptop, tablet, desktop, camera, server, computing system, or other consumer electronic device, etc. As used herein, an input buffer or an input circuit may be included in at least one of these devices.

The feedback circuit 300 includes a feedback resistor circuit 310 and a feedback inverter circuit 330. The first buffer 100 outputs an amplification signal S_A to an output node N_B1 based on an input signal S_IN. For example, the input signal S_IN may include a first input signal S_IN1 and a second input signal S_IN2. The second input signal S_IN2 may be an inversion signal of the first input signal S_IN1. The first buffer 100 may be a differential amplifier that amplifies a difference between the first input signal S_IN1 and the second input signal S_IN2. Also, the second input signal S_IN2 may be a reference signal provided from outside of the first buffer 100. The first buffer 100 may output an amplification signal S_A to an output node N_B1 based on the first input signal S_IN1 and the reference signal. For example, the first buffer 100 may be implemented using an inverter. The inverter may output the amplification signal S_A based on the input signal S_IN.

The feedback circuit 300 may control the amplification signal. The feedback circuit 300 may be connected to the output node N_B1. The feedback circuit 300 may include the feedback resistor circuit 310 and the feedback inverter circuit 330. The feedback resistor circuit 310 may receive the amplification signal S_A from the output node N_B1 and provide a feedback signal S_FB to a feedback node N_FB. The feedback inverter circuit 330 may be, for example, an inverter, and may be connected between the feedback node N_FB and the output node N_B1. The feedback inverter circuit 330 may control the amplification signal S_A based on the feedback signal S_FB from the feedback node N_FB.

As will be described referring to FIG. 9, the feedback inverter circuit 330 may include, for example, an inverter 335. The second buffer circuit 500 may include one or more inverters. The feedback circuit 300 may be connected to the output node N_B1 and may control the amplification signal S_A. The amplification signal S_A may be transferred to a first inverter 501 included in the second buffer circuit 500. The first inverter 501 may provide an inversion amplification signal /S_A to a first inverter node N_INV1 by inverting the amplification signal S_A. A voltage of the first inverter node N_INV1 included in the second buffer circuit 500 may not be decreased by the feedback circuit 300. In a case where the voltage of the first inverter node N_INV1 is decreased, an error between the input signal S_IN and the buffer output signal S_BO may be generated by a duty distortion generated in outputs of the inverters included in the second buffer circuit 500.

The second buffer circuit 500 provides a buffer output signal S_BO by amplifying and buffering the amplification signal S_A from the output node N_B1. The second buffer circuit 500 may include the plurality of inverters 501 to 504. The plurality of inverters 501 to 504 included in the second buffer circuit 500 may provide a buffer output signal S_BO by amplifying the amplification signal S_A stage by stage. For example, in a case where the buffer output signal S_BO is provided by amplifying the amplification signal S_A sixteen times, the first inverter 501 may provide an amplified signal to a second inverter 502 by amplifying the amplification signal S_A two times. The second inverter 502 may provide an amplified signal to a third inverter 503 by amplifying an output signal of the first inverter 501 two times. The third inverter 503 may provide an amplified signal to a fourth inverter 504 by amplifying an output signal of the second inverter 502 two times. The fourth inverter 504 may provide an amplified signal as the buffer output signal S_BO by amplifying an output signal of the third inverter 503 two times.

In the input buffer 10 according to example embodiments, the feedback circuit 300 connected to the output node N_B1 may be separated from the first inverter node N_INV1 included in the second buffer circuit 500. If the feedback circuit 300 is separated from the first inverter node N_INV1, the voltage of the first inverter node N_INV1 may not be decreased by the feedback circuit 300. In a case where the voltage of the first inverter node N_INV1 is decreased, the error between the input signal S_IN and the buffer output signal S_BO may be generated by the duty distortion generated in the outputs of the inverters included in the second buffer circuit 500. If the input buffer 10 according to example embodiments is used, because the voltage of the first inverter node N_INV1 is not decreased by the feedback circuit 300, the input buffer 10 may be operated at high speed.

Figure 3:
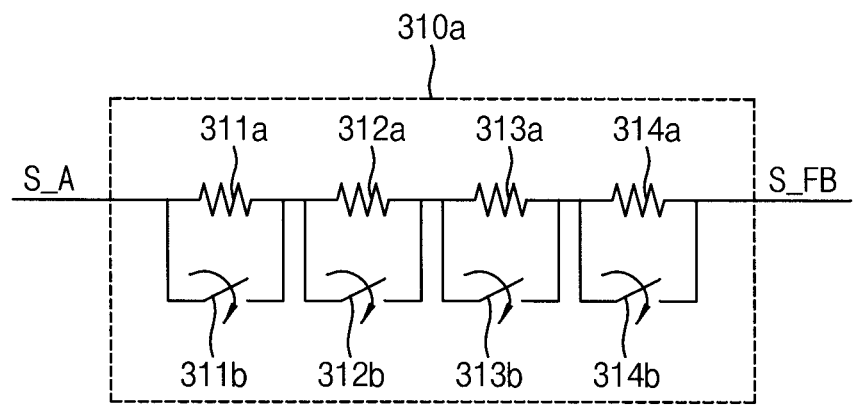
FIG. 3 is a circuit diagram illustrating an example of a feedback resistor included in the feedback circuit of FIG. 2 according to an embodiment.
Figure 4:
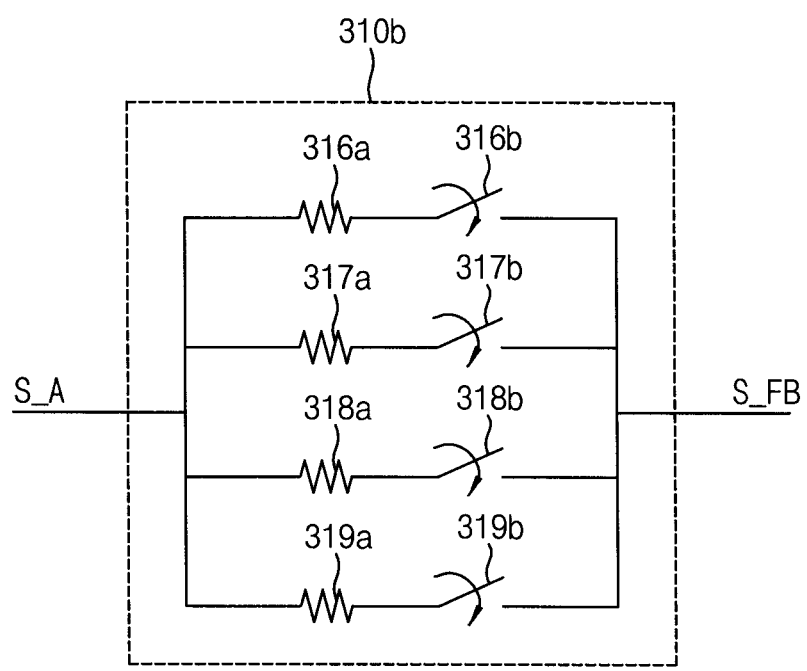
FIG. 4 is a circuit diagram illustrating another example of a feedback resistor included in the feedback circuit of FIG. 2 according to an embodiment.

FIG. 3 is a circuit diagram illustrating an example of a feedback resistor included in the feedback circuit of FIG. 2 according to an embodiment and FIG. 4 is a circuit diagram illustrating another example of a feedback resistor included in the feedback circuit of FIG. 2 according to an embodiment.

Referring to FIG. 3, a feedback resistor circuit 310a may include first to fourth resistors 311a to 314a and first to fourth resistor switches 311b to 314b. The first to fourth resistors 311a to 314a may be connected in series and the first to fourth resistor switches 311b to 314b may be connected to each of the first to fourth resistors 311a to 314a in parallel. The feedback resistor circuit 310a may be a variable resistor. A resistance of the variable resistor may be adjustable.

In an example embodiment, the first to fourth resistors 311a to 314a may be controlled by the first to fourth resistor switches 311b to 314b. In a case where the first resistor switch 311b is turned on, the output node N_B1 may be connected to the feedback node N_FB through the second resistor 312a, the third resistor 313a and the fourth resistor 314a. In a case where the second resistor switch 312b is turned on, the output node N_B1 may be connected to the feedback node N_FB through the first resistor 311a, the third resistor 313a and the fourth resistor 314a. In a case where the third resistor switch 313b is turned on, the output node N_B1 may be connected to the feedback node N_FB through the first resistor 311a, the second resistor 312*a* and the fourth resistor 314*a*. In a case where the fourth resistor switch 314*b* is turned on, the output node N_B1 may be connected to the feedback node N_FB through the first resistor 311*a*, the second resistor 312*a* and the third resistor 313*a*. If a number of the resistor switches that are turned on are increased, the resistance of the variable resistor is decreased. The variable resistor may be a feedback resistor included in the feedback circuit 300. In one embodiment, at least one resistor switch (not shown) may be connected between the output node N_B1 and the feedback node N_FB and the at least one resistor switch is turned off so that the feedback resistor may electrically isolate the output node N_B1 from the feedback node N_FB.

Referring to FIG. 4, a feedback resistor circuit 310*b* may include first to fourth resistors 316*a* to 319*a* and first to fourth resistor switches 316*b* to 319*b*. The first to fourth resistors 316*a* to 319*a* may be connected in parallel and the first to fourth resistor switches 316*b* to 319*b* may be connected to each of the first to fourth resistors 316*a* to 319*a* in series. The feedback resistor circuit 310*b* may be a variable resistor. A resistance of the variable resistor may be adjustable.

In an example embodiment, the first to the fourth resistor 316*a* to 319*a* may be controlled by the first to fourth resistor switches 316*b* to 319*b*. In a case where the first resistor switch 316*b* is turned on, the output node N_B1 may be connected to the feedback node N_FB through the first resistor 316*a*. In a case where the second resistor switch 317*b* is turned on, the output node N_B1 may be connected to the feedback node N_FB through the second resistor 317*a*. In a case where the third resistor switch 318*b* is turned on, the output node N_B1 may be connected to the feedback node N_FB through the third resistor 318*a*. In a case where the fourth resistor switch 319*b* is turned on, the output node N_B1 may be connected to the feedback node N_FB through the fourth resistor 319*a*. If a number of the resistor switches that are turned on are increased, the resistance of the variable resistor is decreased. The variable resistor may be the feedback resistor included in the feedback circuit 300. In one embodiment, the first to fourth resistor switches 316*b* to 319*b* are turned off so that the feedback resistor may electrically isolate the output node N_B1 from the feedback node N_FB.

Figure 5:
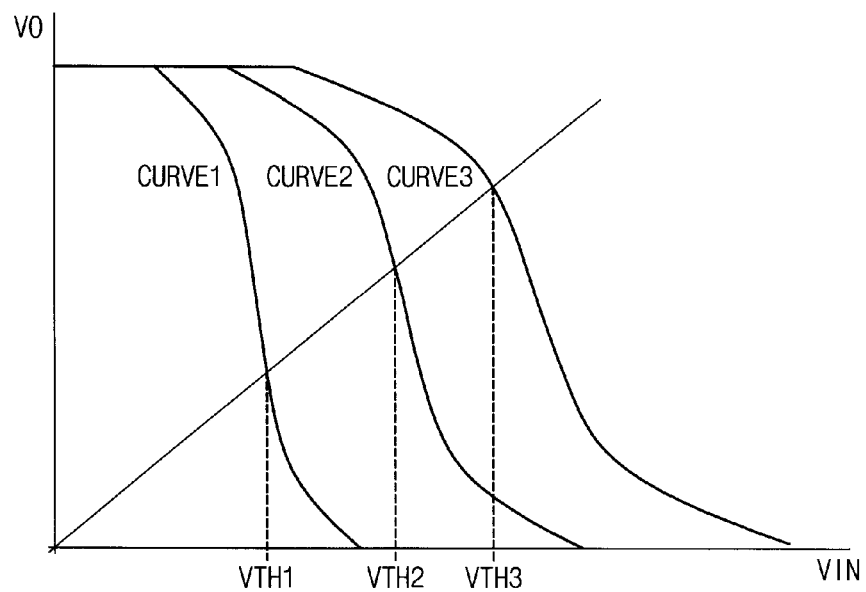
FIG. 5 is a diagram for describing example operations of a feedback inverter included in the feedback circuit of FIG. 2.

FIG. 5 is a diagram for describing an operation of a feedback inverter included in the feedback circuit of FIG. 2.

Figure 9:
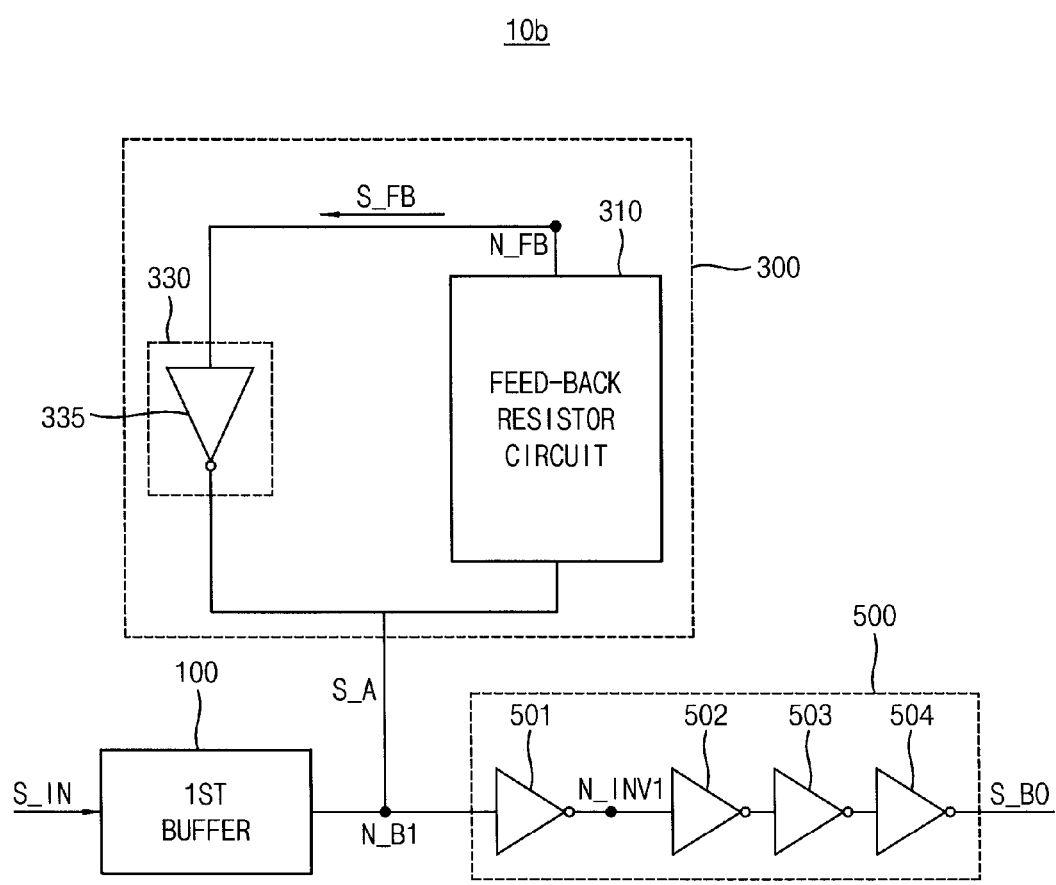
FIG. 9 is a block diagram illustrating an input buffer according to an example embodiment.

Referring to FIGS. 5 and 9, the feedback inverter circuit 330 may include an inverter 335. A logic threshold voltage of the inverter 335 may be adjustable. A logic high voltage and a logic low voltage may be divided based on the logic threshold voltage. For example, the logic threshold voltage of a first curve CURVE1 may be a first threshold voltage VTH1. In a case where an input voltage VIN of the inverter 335 is less than the first threshold voltage VTH1, the input voltage VIN of the inverter 335 may be the logic low voltage and an output voltage VO of the inverter 335 may be the logic high voltage. In a case where an input voltage VIN of the inverter 335 is greater than the first threshold voltage VTH1, the input voltage VIN of the inverter 335 may be the logic high voltage and the output voltage VO of the inverter 335 may be the logic low voltage. The logic threshold voltage of a second curve CURVE2 may be a second threshold voltage VTH2. In a case where an input voltage VIN of the inverter 335 is less than the second threshold voltage VTH2, the input voltage VIN of the inverter 335 may be the logic low voltage and an output voltage VO of the inverter 335 may be the logic high voltage. In a case where an input voltage VIN of the inverter 335 is greater than the second threshold voltage VTH2, the input voltage VIN of the inverter 335 may be the logic high voltage and the output voltage VO of the inverter 335 may be the logic low voltage. The logic threshold voltage of a third curve CURVE3 may be a third threshold voltage VTH3. In a case where an input voltage VIN of the inverter 335 is less than the third threshold voltage VTH3, the input voltage VIN of the inverter 335 may be the logic low voltage and an output voltage VO of the inverter 335 may be the logic high voltage. In a case where an input voltage VIN of the inverter 335 is greater than the third threshold voltage VTH3, the input voltage VIN of the inverter 335 may be the logic high voltage and the output voltage VO of the inverter 335 may be the logic low voltage.

The first threshold voltage VTH1 is less than the second threshold voltage VTH2 and the second threshold voltage VTH2 is less than the third threshold voltage VTH3. In a case where the logic threshold voltage of the inverter 335 is adjustable, the logic threshold voltage of the inverter 335 may be equal to the logic threshold voltage of the first inverter 501 included in the second buffer circuit 500. If the feedback circuit 300 is separated from the first inverter node N_INV1, the voltage of the first inverter node N_INV1 may not be decreased by the feedback circuit 300. In a case where the voltage of the first inverter node N_INV1 is decreased, the error between the input signal S_IN and the buffer output signal S_BO may be generated by the duty distortion generated in the outputs of the inverters included in the second buffer circuit 500. If the input buffer 10 according to example embodiments is used, because the voltage of the first inverter node N_INV1 is not decreased by the feedback circuit 300, the input buffer 10 may be operated at high speed.

Figure 6:
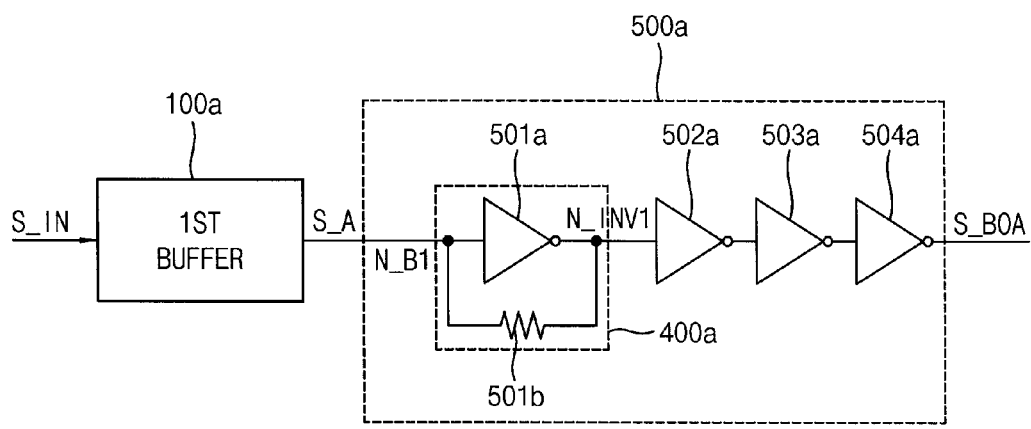
FIG. 6 is a diagram illustrating an example of a conventional input buffer.
Figure 7:
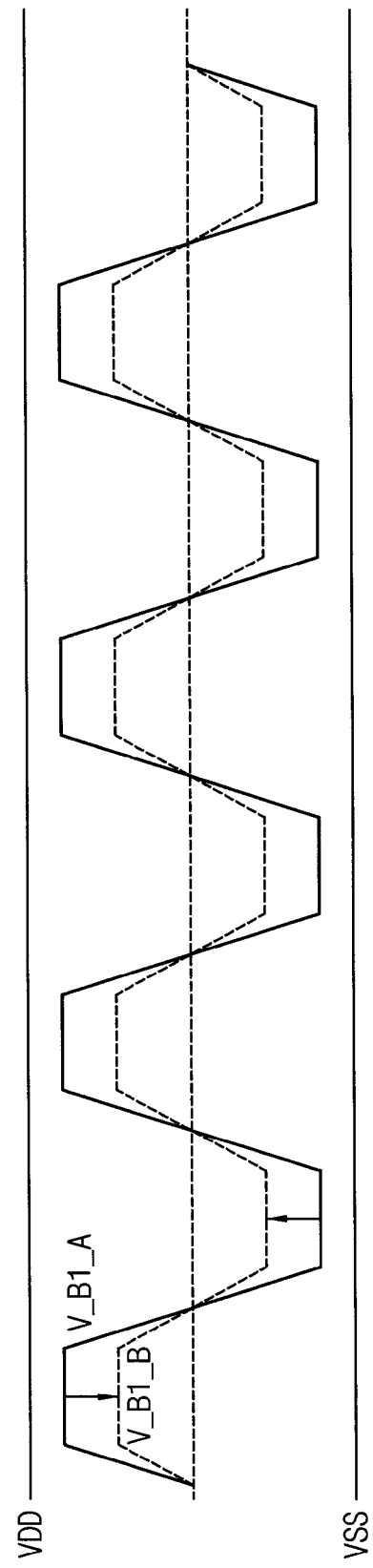
FIG. 7 is a diagram illustrating a voltage of an output node included in the conventional input buffer of FIG. 6.
Figure 8:
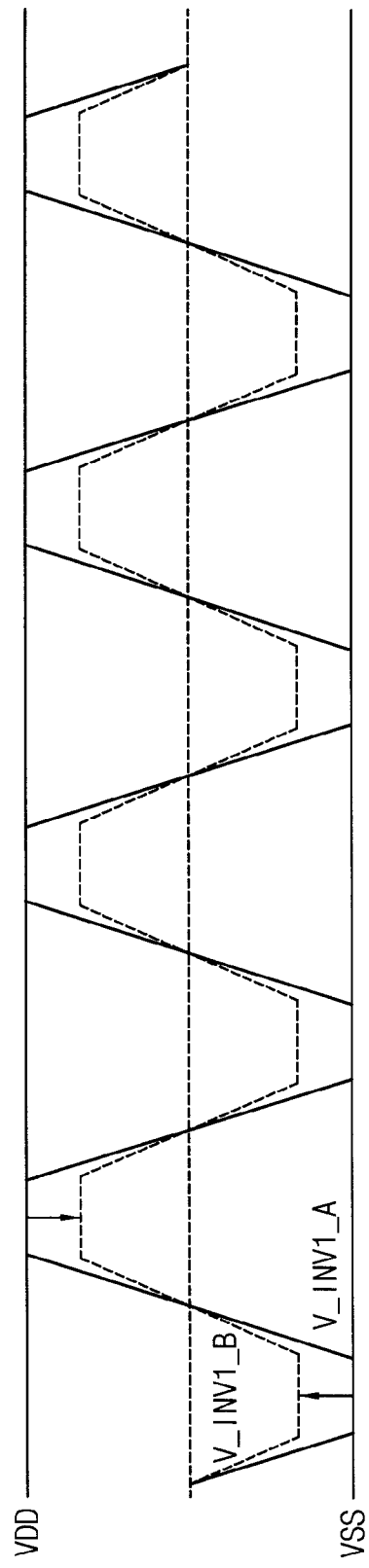
FIG. 8 is a diagram illustrating a voltage of a first inverter node included in the conventional input buffer of FIG. 6.

FIG. 6 is a diagram illustrating an example of a conventional input buffer, FIG. 7 is a diagram illustrating a voltage of an output node included in the conventional input buffer of FIG. 6 and FIG. 8 is a diagram illustrating a voltage of a first inverter node included in the conventional input buffer of FIG. 6.

Referring to FIGS. 6 to 8, the conventional input buffer 10*a* includes a first buffer 100*a* and a second buffer circuit 500*a*. The first buffer 100*a* outputs an amplification signal S_A to an output node N_B1 based on an input signal S_IN. The second buffer circuit 500*a* provides a buffer output signal S_BO by buffering the amplification signal S_A from the output node N_B1. In the conventional input buffer 10*a*, a feedback resistor 501*b* is connected between an input node and an output node of a first inverter 501*a* included in the second buffer circuit 500*a*. The input node of the first inverter 501*a* included in the second buffer circuit 500*a* is the output node N_B1. The output node of the first inverter 501*a* included in the second buffer circuit 500*a* is a first inverter node N_INV1. A feedback circuit 400*a* is formed by the feedback resistor 501*b* and the first inverter 501*a* included in the second buffer circuit 500*a*.

Referring to FIG. 7, in a case where the feedback resistor 501*b* of the feedback circuit 400*a* is not formed between the output node N_B1 and the first inverter node N_INV1, the voltage of the output node N_B1 may be marked as a solid line. In a case where the feedback circuit 400*a* is formed between the output node N_B1 and the first inverter node N_INV1, the voltage of the output node N_B1 may be marked as a dotted line. The voltage of the output node N_B1 in a case where the feedback circuit 400*a* is formed between the output node N_B1 and the first inverter node N_INV1 may be less than the voltage of the output node N_B1 in a case where the feedback circuit is not formed between the output node N_B1 and the first inverter node N_INV1.

Referring to FIG. 8, in a case where the feedback resistor 501*b* of the feedback circuit 400*a* is not formed between the output node N_B1 and the first inverter node N_INV1, the voltage of the first inverter node N_INV1 may be marked as a solid line. In a case where the feedback circuit 400a is formed between the output node N_B1 and the first inverter node N_INV1, the voltage of the first inverter node N_INV1 may be marked as a dotted line. The voltage of the first inverter node N_INV1 in a case where the feedback circuit 400a is formed between the output node N_B1 and the first inverter node N_INV1 may be less than the voltage of the first inverter node N_INV1 in a case where the feedback resistor 501b of the feedback circuit 400a is not formed between the output node N_B1 and the first inverter node N_INV1. In a case where the input buffer 10a is operated at high speed, if the voltage of the first inverter node N_INV1 is decreased, the error between the input signal S_IN and the buffer output signal S_BO may be generated by the duty distortion generated in the outputs of the inverters included in the second buffer circuit 500a.

Figure 10:
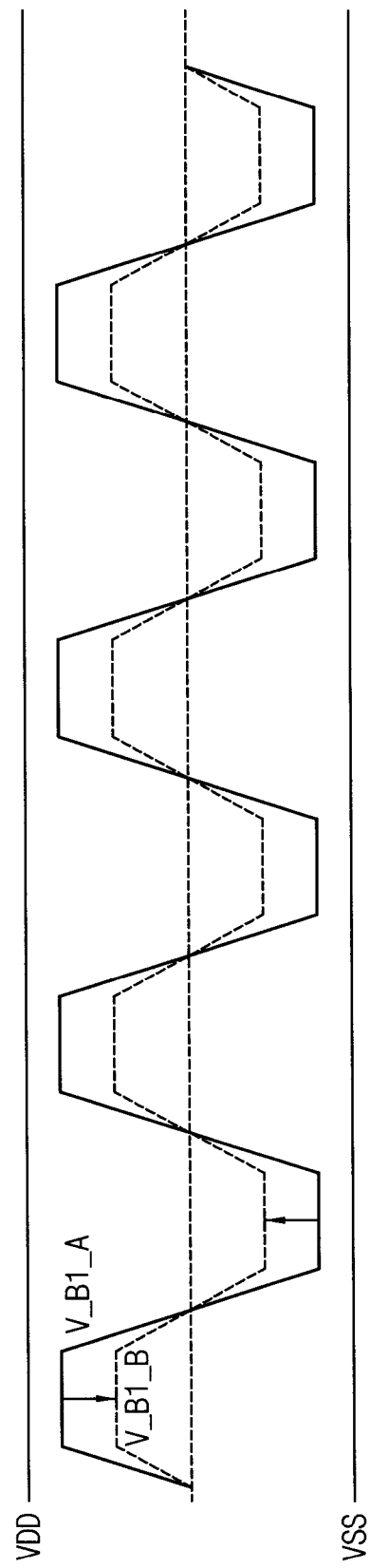
FIG. 10 is a diagram illustrating a voltage of an output node included in the input buffer of FIG. 9.
Figure 11:
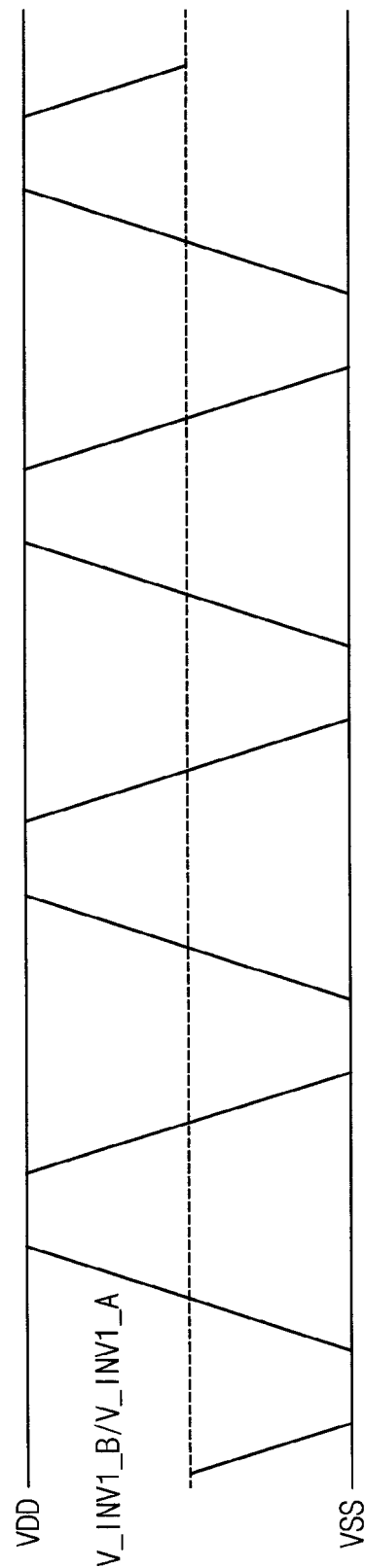
FIG. 11 is a diagram illustrating a voltage of a first inverter node included in the input buffer of FIG. 9.

FIG. 9 is a block diagram illustrating an input buffer according to an example embodiment and FIG. 10 is a diagram illustrating a voltage of an output node included in the input buffer of FIG. 9 and FIG. 11 is a diagram illustrating a voltage of a first inverter node included in the input buffer of FIG. 9.

Referring to FIGS. 9 to 11, an input buffer 10b includes a first buffer 100, a feedback circuit 300 and a second buffer circuit 500. The first buffer 100 outputs an amplification signal S_A to an output node N_B1 based on an input signal S_IN. For example, the input signal S_IN may include a first input signal S_IN1 and a second input signal S_IN2. The second input signal S_IN2 may be an inversion signal of the first input signal S_IN1.

The feedback circuit 300 connected to the output node N_B1 controls the amplification signal S_A. The feedback circuit 300 may include the feedback resistor circuit 310 and the feedback inverter circuit 330. The feedback resistor circuit 310 may receive the amplification signal S_A from the output node N_B1 and provide a feedback signal S_FB to a feedback node N_FB. The feedback inverter circuit 330 may be connected between the feedback node N_FB and the output node N_B1. The feedback inverter circuit 330 may control the amplification signal S_A based on the feedback signal S_FB from the feedback node N_FB.

The feedback inverter circuit 330 may include, for example, an inverter 335. The second buffer circuit 500 may include a plurality of inverters 501 to 504. The feedback circuit 300 may be connected to the output node N_B1 and may control the amplification signal S_A. The amplification signal S_A may be transferred to a first inverter 501 included in the second buffer circuit 500. The first inverter 501 may provide an inversion amplification signal /S_A to a first inverter node N_INV1 by inverting the amplification signal S_A. A voltage of the first inverter node N_INV1 included in the second buffer circuit 500 may not be decreased by the feedback circuit 300. In a case where the voltage of the first inverter node N_INV1 is decreased, an error between the input signal S_IN and the buffer output signal S_BO may be generated by a duty distortion generated in outputs of the inverters included in the second buffer circuit 500.

The second buffer circuit 500 provides a buffer output signal S_BO by buffering the amplification signal S_A from the output node N_B1.

In an example embodiment, the logic threshold voltage of the inverter 335 may be equal to a logic threshold voltage of a first inverter 501 included in the second buffer circuit 500. For example, the feedback circuit 400a included in the input buffer 10a of FIG. 6 may be the feedback circuit 300 included in the input buffer 10b of FIG. 9. The feedback resistor 501b of FIG. 6 may correspond to the variable resistor included in the feedback resistor circuit 310 of FIG. 9. The first inverter 501a included in the second buffer circuit 500a of FIG. 6 may be the inverter 335 included in the feedback inverter circuit 330 of FIG. 9. In a case where the feedback circuit 300 is separated from the second buffer circuit 500 as illustrated in FIG. 9, the decrease of the voltage of the first inverter node N_INV1 may be prevented. In this case, even though the input buffer 10b is operated at high speed, the duty distortion may not be generated in the outputs of the inverters included in the second buffer circuit 500. If the input buffer 10b according to example embodiments is used, because the voltage of the first inverter node N_INV1 is not decreased by the feedback circuit 300, the input buffer 10b may be operated at high speed. In this case, the feedback circuit 300 may have the same characteristics as the feedback circuit 400a included in the second buffer circuit 500a of FIG. 6. Therefore, the logic threshold voltage of the inverter 335 may be equal to the logic threshold voltage of the first inverter 501 included in the second buffer circuit 500.

In one embodiment, a driving capability of each of the first buffer 100 and the first inverter 501 may be greater than a driving capability of the inverter 335 included in the feedback inverter circuit 330.

Referring to FIG. 10, in a case where the feedback circuit 300 is not formed between the output node N_B1 and the first inverter node N_INV1, the voltage of the output node N_B1 may be marked as a solid line. In a case where the feedback circuit 300 is formed between the output node N_B1 and the first inverter node N_INV1, the voltage of the output node N_B1 may be marked as a dotted line. The voltage of the output node N_B1 in a case where the feedback circuit 300 is formed between the output node N_B1 and the first inverter node N_INV1 may be less than the voltage of the output node N_B1 in a case where the feedback circuit 300 is not formed between the output node N_B1 and the first inverter node N_INV1.

Referring to FIG. 11, in a case where the feedback circuit 300 is not formed between the output node N_B1 and the first inverter node N_INV1, the voltage of the first inverter node N_INV1 may be marked as a solid line. In a case where the feedback circuit 300 is formed between the output node N_B1 and the first inverter node N_INV1, the voltage of the first inverter node N_INV1 may be marked as the same solid line. The voltage of the first inverter node N_INV1 in a case where the feedback circuit 300 is formed between the output node N_B1 and the first inverter node N_INV1 may be equal to the voltage of the first inverter node N_INV1 in a case where the feedback circuit 300 is not formed between the output node N_B1 and the first inverter node N_INV1. In a case where the feedback circuit 300 is separated from the first inverter 501 included in the second buffer circuit 500, the voltage of the first inverter node N_INV1 included in the second buffer circuit 500 may not be decreased. In a case where the voltage of the first inverter node N_INV1 is decreased, an error between the input signal S_IN and the buffer output signal S_BO may be generated by a duty distortion generated in outputs of the inverters included in the second buffer circuit 500. If the input buffer 10b according to example embodiments is used, because the voltage of the first inverter node N_INV1 is not decreased by the feedback circuit included in the feedback circuit 300, the input buffer 10b may be operated at high speed.

Figure 12:
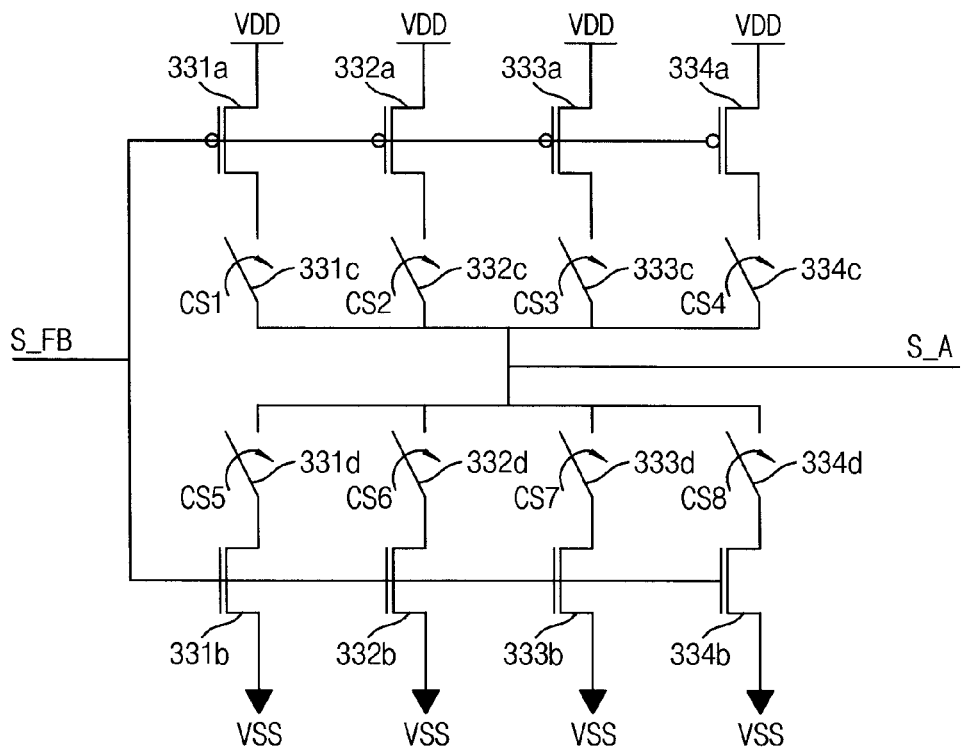
FIG. 12 is a circuit diagram illustrating an example of a feedback inverter included in the input buffer of FIG. 9 according to an embodiment.

FIG. 12 is a circuit diagram illustrating an example of a feedback inverter included in the input buffer of FIG. 9 according to an embodiment.

Referring to FIG. 12, the feedback inverter circuit 330 may include first to fourth P-MOS transistors 331a to 334a, first to fourth N-MOS transistors 331b to 334b and first to eighth transistor switches 331c to 334c and 331d to 334d. The first to fourth P-MOS transistors 331a to 334a may be connected to a power supply voltage VDD. The first to fourth N-MOS transistors 331b to 334b may be connected to a ground voltage VSS. The first to fourth transistor switches 331c to 334c may connect each of the first to fourth P-MOS transistors 331a to 334a to the output node N_B1. The fifth to eighth transistor switches 331d to 334d may connect each of the first to fourth N-MOS transistors 331b to 334b to the output node N_B1.

In an example embodiment, the first to eighth transistor switches 331c to 334c and 331d to 334d may be independently controlled based on respective control signals CS1 to CS8 provided from outside of the input buffer 10b. The control signals CS1 to CS8 may be provided from a mode register set MRS included in a memory device or from a memory controller.

Though exemplary numbers of transistors and switches are disclosed herein, other amounts may be used, and this disclosure is not limited to the exemplary numbers described. A logic threshold voltage of the inverter circuit 330 may be adjustable by controlling the first to fourth P-MOS transistors 331a to 334a based on the first to fourth control signals CS1 to CS4. Also, the logic threshold voltage of the feedback inverter circuit 330 may be adjustable by controlling the first to fourth N-MOS transistors 331b to 334b based on the fifth to eighth control signals CS5 to CS8. In addition, the logic threshold voltage of the feedback inverter circuit 330 may be adjustable by controlling the first to fourth P-MOS transistors 331a to 334a and the first to fourth N-MOS transistors 331b to 334b based on the first to eighth control signals CS1 to CS8 at the same time. The logic threshold voltage of the feedback inverter circuit 330 may be adjustable using the first to eighth control signals CS1 to CS8. The first to eighth control signals CS1 to CS8 may be controlled so that the logic threshold voltage of the feedback inverter circuit 330 is substantially equal to the logic threshold voltage of the first inverter 501 included in the second buffer circuit 500.

The feedback circuit 400a included in the input buffer 10a of FIG. 6 may be the feedback circuit feedback 300 of FIG. 9. The feedback resistor 501b of FIG. 6 may correspond to the variable resistor included in the feedback resistor circuit 310 of FIG. 9. The first inverter 501a included in the second buffer circuit 500a of FIG. 6 may be the inverter 335 included in the feedback inverter circuit 330 of FIG. 9. In a case where the feedback circuit 300 is separated from the second buffer circuit 500 as illustrated in FIG. 9, the decrease of the voltage of the first inverter node N_INV1 may be prevented. For example, even though the input buffer 10b is operated at high speed, the duty distortion may not be generated in the outputs of the inverters included in the second buffer circuit 500. If the input buffer 10b according to example embodiments is used, because the voltage of the first inverter node N_INV1 is not decreased by the feedback circuit 300, the input buffer 10b may be operated at high speed. For example, the feedback circuit 300 may have the same characteristics as the feedback circuit 400a included in the second buffer circuit 500a of FIG. 6. Therefore, the logic threshold voltage of the inverter 335 included in the feedback inverter circuit 330 may be substantially equal to the logic threshold voltage of the first inverter 501 included in the second buffer circuit 500.

In an example embodiment, the logic threshold voltage of the inverter 335 may be adjustable by controlling each of the P-MOS transistors 331a to 334a and the N-MOS transistors 331b to 334b based on the control signals CS1 to CS8.

Figure 13:
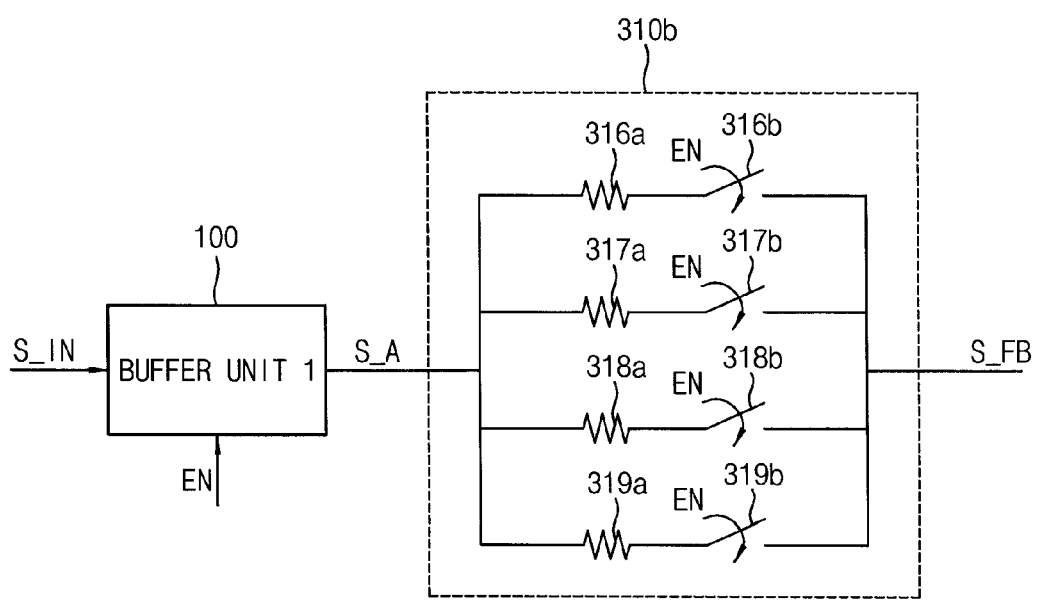
FIG. 13 is a diagram illustrating an example of a feedback resistor being controlled by an enable signal according to an embodiment.

FIG. 13 is a diagram illustrating an example of a feedback resistor being controlled by an enable signal according to an embodiment.

Referring to FIGS. 9 and 13, a feedback resistor circuit 310b may include first to fourth resistors 316a to 319a and first to fourth resistor switch 316b to 319b. The feedback resistor circuit 310b may be a variable resistor. The resistance of the variable resistor may be adjustable. In an example embodiment, the first buffer 100 may be turned on or turned off based on an enable signal EN provided from outside of the input buffer 10b.

For example, in a case where the first buffer 100 is turned off based on the enable signal EN provided from outside of the input buffer 10, the first resistor switch 316b connected between the first resistor 316a and the feedback node N_FB is turned off, the second resistor switch 317b connected between the second resistor 317a and the feedback node N_FB is turned off, the third resistor switch 318b connected between the third resistor 318a and the feedback node N_FB is turned off, and the fourth resistor switch 319b connected between the fourth resistor 319a and the feedback node N_FB is turned off. In a case where the operation of the first buffer 100 is stopped, the operation of the input buffer 10b may be stopped. In a case where the operation of the input buffer 10b is stopped, the resistor switches 316b to 319b included in the feedback resistor circuit 310b may be turned off.

In an example embodiment, in a case where the first buffer 100 is turned off based on the enable signal EN, the resistor switches 316b to 319b connected in the parallel included in the feedback circuit 300 may be turned off.

In the input buffer 10b according to example embodiments, the feedback circuit 300 connected to the output node N_B1 may be separated from the first inverter node N_INV1 included in the second buffer circuit 500. If the feedback circuit 300 is separated from the first inverter node N_INV1, the voltage of the first inverter node N_INV1 may not be decreased by the feedback circuit 300. In a case where the voltage of the first inverter node N_INV1 is decreased, the error between the input signal S_IN and the buffer output signal S_BO may be generated by the duty distortion generated in the outputs of the inverters included in the second buffer circuit 500. If the input buffer 10b according to example embodiments is used, because the voltage of the first inverter node N_INV1 is not decreased by the feedback circuit 300, the input buffer 10b may be operated at high speed.

Figure 14:
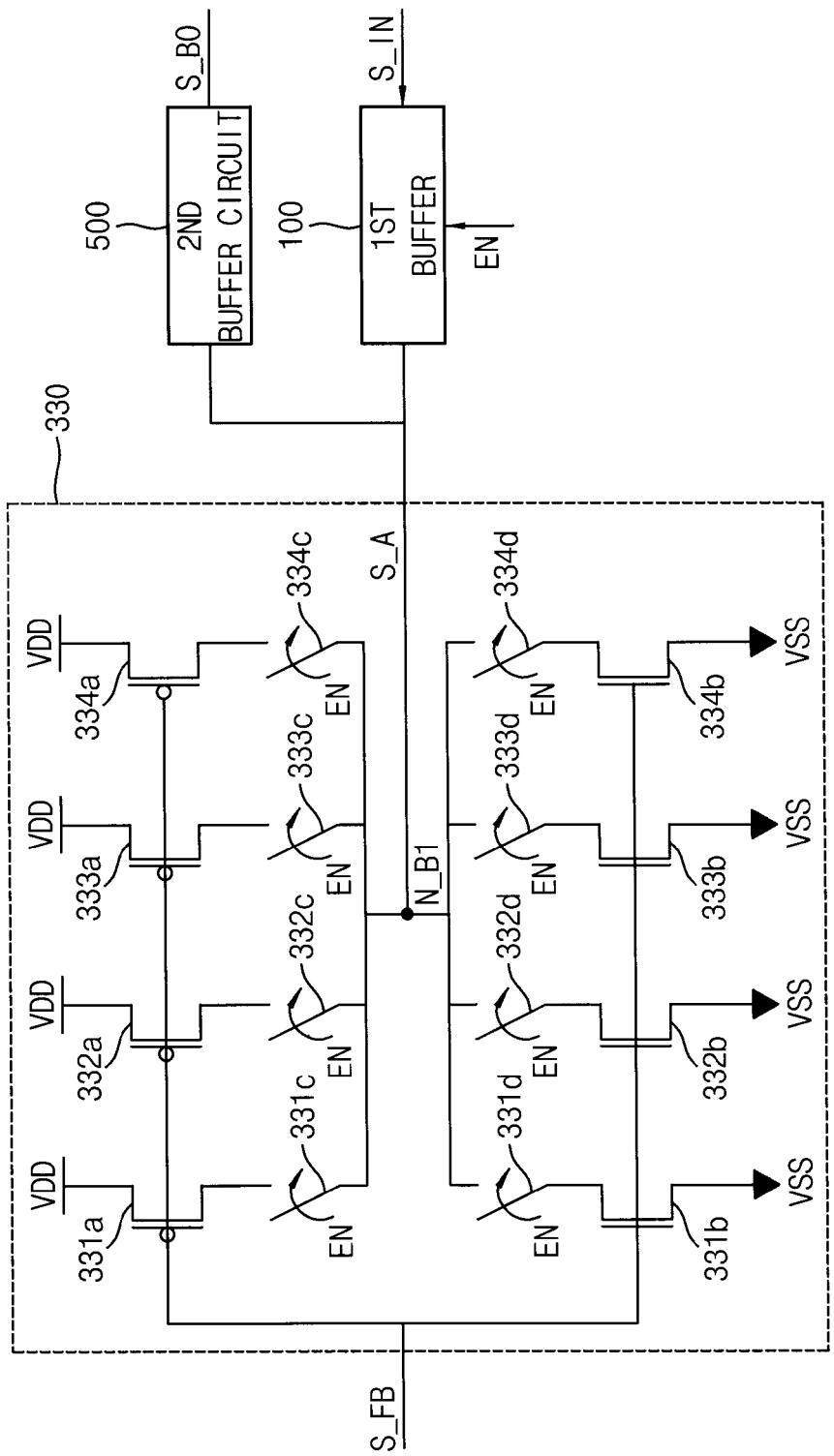
FIG. 14 is a diagram illustrating an example of a feedback inverter according to an embodiment.

FIG. 14 is a diagram illustrating an example of a feedback inverter according to an embodiment.

Referring to FIG. 14, a feedback inverter circuit 330 may be included in the feedback inverter circuit 300 of FIG. 9. The feedback inverter circuit 330 may include first to fourth P-MOS transistors 331a to 334a, first to fourth N-MOS transistors 331b to 334b and first to eighth transistor switches 331c to 334c and 331d to 334d. The first to fourth P-MOS transistors 331a to 334a may be connected to a power supply voltage VDD. The first to fourth N-MOS transistors 331b to 334b may be connected to a ground voltage VSS. The first to fourth transistor switches 331c to 334c may connect each of the first to fourth P-MOS transistors 331a to 334a to the output node N_B1. The fifth to eighth transistor switches 331d to 334d may connect each of the first to fourth N-MOS transistors 331b to 334b to the output node N_B1.

In an example embodiment, in a case where the first buffer 100 is turned off based on the enable signal EN, the transistor switches 331c to 334c and 331d to 334d included in the feedback circuit 300 may be turned off.

For example, when the first buffer 100 is turned off based on the enable signal EN, the first to eighth transistor switches 331c to 334c and 331d to 334d are turned off based on the enable signal EN. In a case where the operation of the first buffer 100 is stopped, the operation of the input buffer 10b may be stopped. Even though the operation of the input buffer 10b is stopped, if the first to eighth transistor switches 331c to 334c and 331d to 334d are turned on, current may be flowed between the power supply voltage VDD and the ground voltage VSS. In a case where the operation of the input buffer 10b is stopped, the first to eighth transistor switches 331c to 334c and 331d to 334d may be turned off to stop flowing the current between the power supply voltage VDD and the ground voltage VSS. In one embodiment, the feedback inverter circuit 330 of FIG. 12 and at least one transistor switch (not shown) connected between node N_B1 and the feedback circuit 300 may be replaced with the feedback inverter circuit 330 of FIG. 14. The at least one transistor switch may electrically isolate the node N-B1 from the feedback circuit 300 so that the current consumption of the feedback inverter circuit 330 may be prevented.

Figure 15:
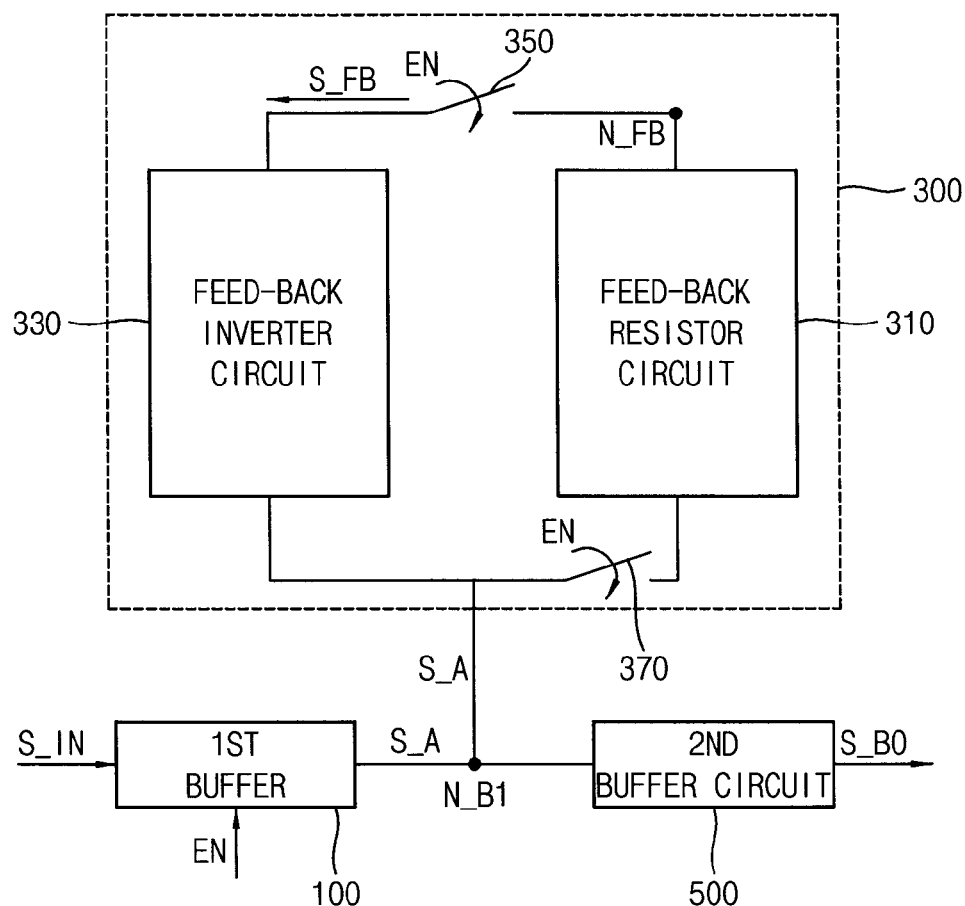
FIG. 15 is a block diagram illustrating an input buffer according to an example embodiment.

FIG. 15 is a block diagram illustrating an input buffer according to an example embodiment.

Referring to FIG. 15, an input buffer 10c includes a first buffer 100, a feedback circuit 300 and a second buffer circuit 500. The first buffer 100 outputs an amplification signal S_A to an output node N_B1 based on an input signal S_IN. The feedback circuit 300 connected to the output node N_B1 controls the amplification signal S_A. The second buffer circuit 500 provides a buffer output signal S_BO by buffering the amplification signal S_A from the output node N_B1.

In an example embodiment, the feedback circuit 300 may further comprise feedback switches 350 and 370 connected between the feedback resistor circuit 310 and the feedback inverter circuit 330. In a case where the first buffer 100 is turned off based on the enable signal EN, the feedback switches 350 and 370 may be turned off. For example, the feedback switch 350 may be formed on a conducting wire transferring the feedback signal S_FB to the feed back inverter circuit 330. Also, the feedback switch 370 may be formed on a conducting wire transferring the amplification signal S_A to the feedback resistor circuit 310. For example, when the operation of the first buffer 100 is stopped, the operation of the input buffer 10c may be stopped. In a case where the operation of the input buffer 10c is stopped, the feedback switches 350 and 370 included in the feedback circuit 300 may be turned off.

Figure 16:
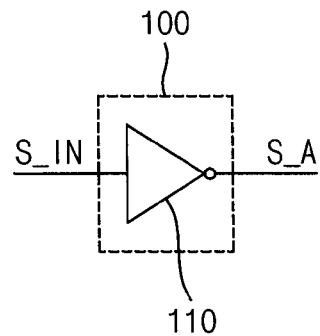
FIG. 16 is a diagram illustrating an example of a first buffer included in the input buffer of FIG. 1 according to an embodiment.
Figure 17:
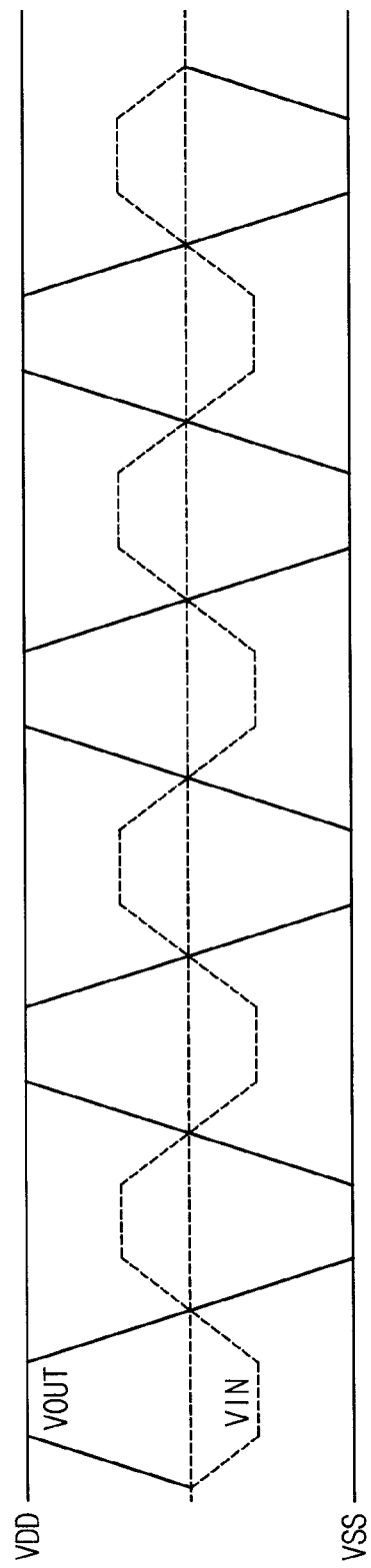
FIG. 17 is a diagram for describing an operation of the first buffer of FIG. 16.

FIG. 16 is a diagram illustrating an example of a first buffer included in the input buffer of FIG. 1 according to an embodiment and FIG. 17 is a diagram for describing an operation of the first buffer of FIG. 16.

Referring to FIGS. 16 and 17, the first buffer 100 may include an inverter 110. The first buffer 100 may amplify the input signal S_IN. The inverter 110 included in the first buffer 100 may be used as an amplifier. For example, the input voltage VIN of the inverter 110 included in the first buffer 100 may be marked as a dotted line. In one embodiment, when the node N_B1 is not connected to the feedback circuit 300, an output voltage VOUT of the inverter 110 included in the first buffer 100 may be marked as a solid line. In a case where the input voltage VIN of the inverter 110 included in the first buffer 100 is less than a logic threshold voltage of the inverter 110, the output voltage VOUT of the inverter 110 may be the power supply voltage VDD. In a case where the input voltage VIN of the inverter 110 included in the first buffer 100 is greater than the logic threshold voltage of the inverter 110, the output voltage VOUT of the inverter 110 may be the ground voltage VSS. As a result, the output voltage VOUT of the inverter 110 may be the power supply voltage VDD or the ground voltage VSS amplified based on the input voltage VIN.

Figure 18:
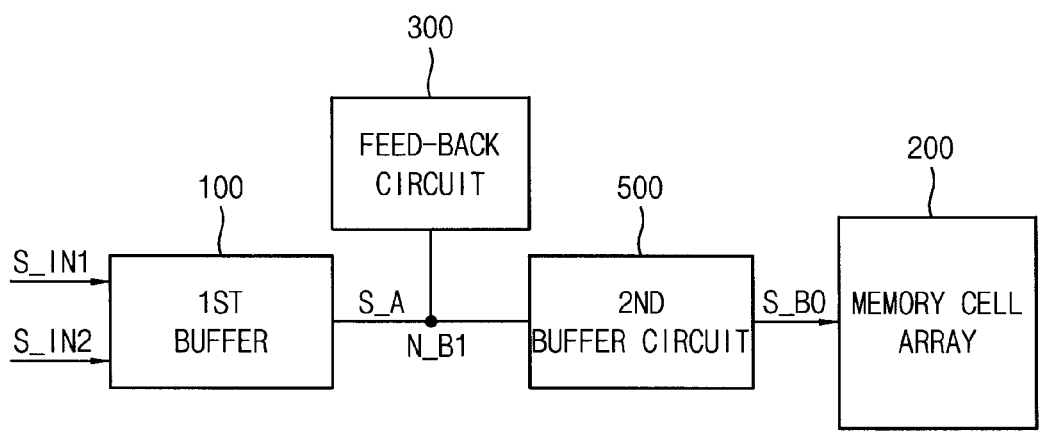
FIG. 18 is a block diagram illustrating a memory device according to example embodiments.

FIG. 18 is a block diagram illustrating a memory device according to example embodiments.

Referring to FIGS. 9 and 18, a memory device 20 includes an input buffer 10 (e.g., 10b and 10c) and a memory cell array 200. The input buffer 10 outputs a buffer output signal S_BO based on an input signal S_IN (e.g., S_IN1 and S_IN2). The memory cell array 200 may store data corresponding to the buffer output signal S_BO. The feedback circuit 300 may include a feedback resistor circuit 310 and a feedback inverter circuit 330.

The input buffer 10 includes a first buffer 100, a feedback circuit 300 and a second buffer circuit 500. The first buffer 100 outputs an amplification signal S_A to an output node N_B1 based on the input signal S_IN. For example, the input signal S_IN may include a first input signal S_IN1 and a second input signal S_IN2. The second input signal S_IN2 may be an inversion signal of the first input signal S_IN1. The first buffer 100 may be a differential amplifier that amplifies a difference between the first input signal S_IN1 and the second input signal S_IN2. For example, the second input signal S_IN2 may be a reference signal provided from outside of the first buffer 100. The first buffer 100 may output an amplification signal S_A to an output node N_B1 based on the first input signal S_IN1 and the reference signal. In one embodiment, the first buffer 100 may be implemented using an inverter. For example, the inverter of the first buffer 100 may receive one input signal instead of two input signals. The inverter of the first buffer 100 may output the amplification signal S_A based on the input signal S_IN.

The feedback circuit 300 connected to the output node N_B1 controls the amplification signal S_A. The feedback circuit 300 may include the feedback resistor circuit 310 and the feedback inverter circuit 330. The feedback resistor circuit 310 may receive the amplification signal S_A from the output node N_B1 and provide a feedback signal S_FB to a feedback node N_FB. The feedback inverter circuit 330 may be connected between the feedback node N_FB and the output node N_B1. The feedback inverter circuit 330 may control the amplification signal S_A based on the feedback signal S_FB from the feedback node N_FB.

The feedback inverter circuit 330 may include inverter 335. The second buffer circuit 500 may include one or more inverters. The feedback circuit 300 may be connected to the output node N_B1 and may control the amplification signal S_A. The amplification signal S_A is transferred to a first inverter 501 included in the second buffer circuit 500. The first inverter 501 may provide an inversion amplification signal /S_A to a first inverter node N_INV1 by inverting the amplification signal S_A. A voltage of the first inverter node N_INV1 included in the second buffer circuit 500 may not be decreased by the feedback circuit 300. In a case where the voltage of the first inverter node N_INV1 is decreased, an error between the input signal S_IN and the buffer output signal S_BO may be generated by a duty distortion generated in outputs of the inverters included in the second buffer circuit 500.

The second buffer circuit 500 provides a buffer output signal S_BO by buffering the amplification signal S_A from the output node N_B1. The second buffer circuit 500 may include a plurality of inverters. The plurality of inverters included in the second buffer circuit 500 may provide a buffer output signal S_BO by amplifying the amplification signal S_A stage by stage. For example, in a case where the buffer output signal S_BO is provided by amplifying the amplification signal S_A sixteen times, the first inverter 501 may provide an amplified signal to a second inverter 502 by amplifying the amplification signal S_A two times. The second inverter 502 may provide an amplified signal to a third inverter 503 by amplifying an output signal of the first inverter 501 two times. The third inverter 503 may provide an amplified signal to a fourth inverter 504 by amplifying an output signal of the second inverter 502 two times. The fourth inverter 504 may provide an amplified signal as the buffer output signal S_BO by amplifying an output signal of the third inverter 503 two times.

In the input buffer 10 according to example embodiments, the feedback circuit 300 connected to the output node N_B1 may be separated from the first inverter node N_INV1 included in the second buffer circuit 500. If the feedback circuit 300 is separated from the first inverter node N_INV1, the voltage of the first inverter node N_INV1 may not be decreased by the inverter 335 included in the feedback circuit 300. In a case where the voltage of the first inverter node N_INV1 is decreased, the error between the input signal S_IN and the buffer output signal S_BO may be generated by the duty distortion generated in the outputs of the inverters included in the second buffer circuit 500. If the input buffer 10 according to example embodiments is used, because the voltage of the first inverter node N_INV1 is not decreased by the inverter 335 included in the feedback circuit 300, the input buffer 10 may be operated at high speed.

Figure 19:
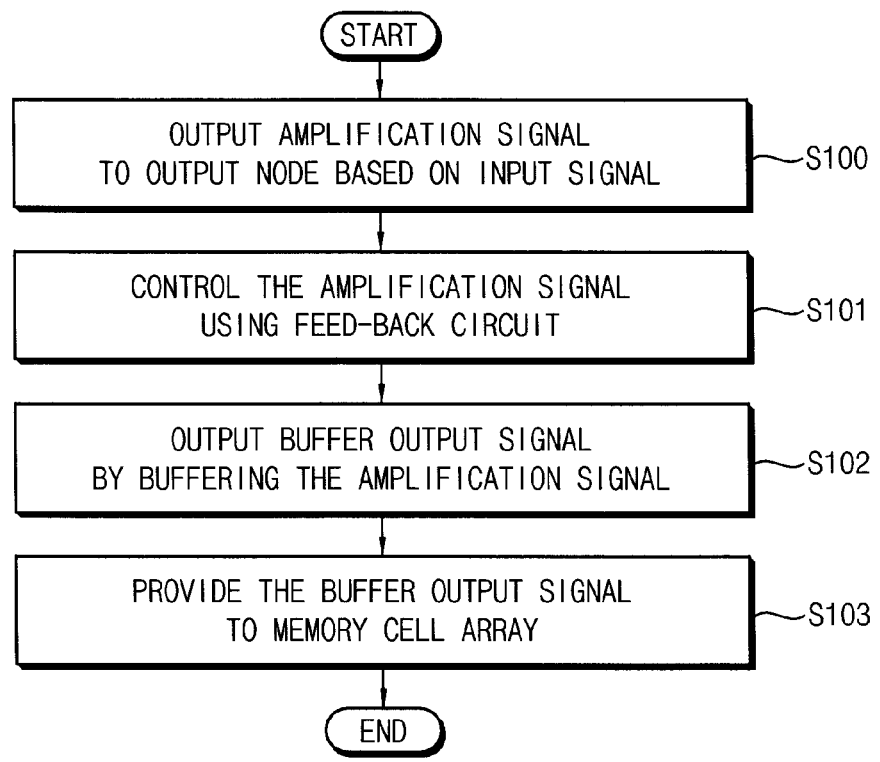
FIG. 19 is a flow chart illustrating a method of operating a memory device according to example embodiments.

FIG. 19 is a flow chart illustrating a method of operating a memory device according to example embodiments.

Referring to FIG. 19, in a method of operating a memory device according to example embodiments, a first buffer 100 outputs an amplification signal S_A to an output node N_B1 based on an input signal S_IN (S100). The amplification signal S_A is controlled using a feedback circuit connected to the output node N_B1 (S101). A second buffer circuit 500 outputs a buffer output signal S_BO by buffering the amplification signal S_A from the output node N_B1 (S102). The buffer output signal S_BO is provided to a memory cell array (S103). In controlling the amplification signal S_A, a feedback resistor circuit 310 included in the feedback circuit 300 receives the amplification signal S_A from the output node N_B1 and provides a feedback signal S_FB to a feedback node N_FB. A feedback inverter circuit 330 included in the feedback circuit 300 controls the amplification signal S_A based on the feedback signal S_FB.

In an example embodiment, the input signal S_IN transferred to the first buffer 100 may include a first input signal S_IN1 and a second input signal S_IN2. The second input signal S_IN2 may be an inversion signal of the first input signal S_IN1.

In an example embodiment, the input signal S_IN transferred to the first buffer 100 may include a first input signal S_IN1 and a second input signal S_IN2. The second input signal S_IN2 may be a reference signal provided from outside of an input buffer 10 including the first buffer 100.

Figure 20:
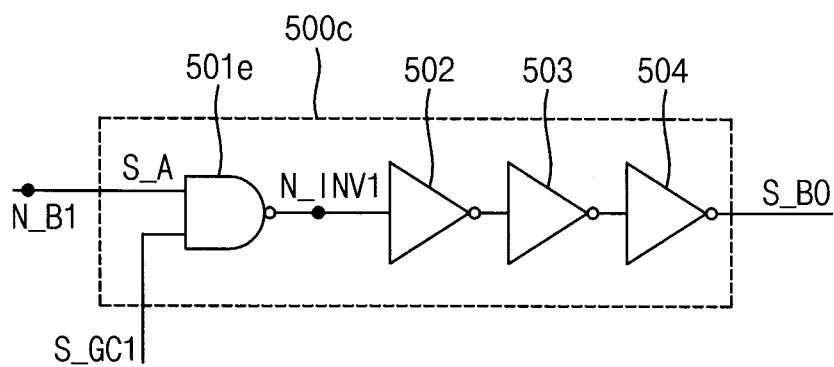
FIG. 20 is a circuit diagram illustrating an example of a second buffer circuit included in the input buffer of FIG. 18 according to an embodiment.

FIG. 20 is a circuit diagram illustrating an example of a second buffer circuit included in the input buffer of FIG. 18 according to an embodiment.

Referring to FIG. 20, the second buffer circuit 500c may be implemented using logic gates. A logic threshold voltage of the logic gate may be equal to a logic threshold voltage of the inverter 335 included in the feedback inverter circuit 330. For example, the second buffer circuit 500c may include a logic gate and one or more inverters. The logic gate may be a NAND gate 501e. A first gate control signal S_GC1 may be transferred to one of the inputs of the NAND gate 501e. If the first gate control signal S_GC1 is a logic high voltage and the amplification signal S_A is the logic high voltage, an output of the NAND gate 501e may be the logic low voltage. If the first gate control signal S_GC1 is the logic high voltage and the amplification signal S_A is the logic low voltage, the output of the NAND gate 501e may be the logic high voltage. For example, the NAND gate 501e may be used as an inverter. The first gate control signal S_GC1 may be used as the signal controlling the second buffer circuit 500c.

Figure 21:
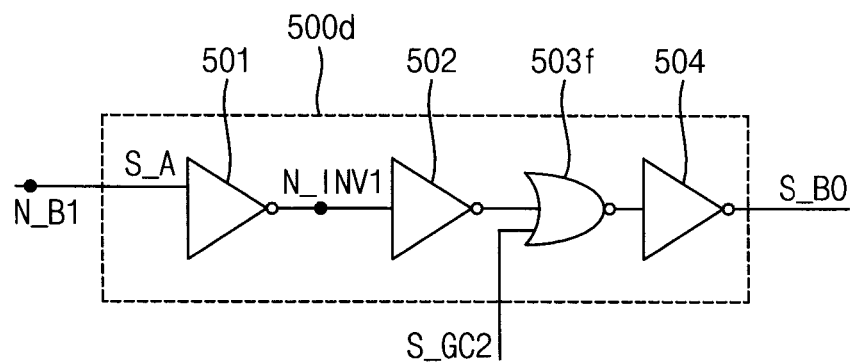
FIG. 21 is a circuit diagram illustrating another example of a second buffer circuit included in the input buffer of FIG. 18 according to an embodiment.

FIG. 21 is a circuit diagram illustrating another example of a second buffer circuit included in the input buffer of FIG. 18 according to an embodiment.

Referring to FIG. 21, the second buffer circuit 500d may include a logic gate and one or more inverters. The logic gate may be a NOR gate 503f. A second gate control signal S_GC2 may be transferred to one of the inputs of the NOR gate 503f. If the second gate control signal S_GC2 is the logic low voltage and the amplification signal S_A is the logic high voltage, an output of the NOR gate 503f may be the logic low voltage. If the second gate control signal S_GC2 is the logic low voltage and the amplification signal S_A is the logic low voltage, the output of the NOR gate 503f may be the logic high voltage. For example, the NOR gate 503f may be used as an inverter. The second gate control signal S_GC2 may be used as the signal controlling the second buffer circuit 500d.

In an example embodiment, each of the gate control signals S_GC1 and S_GC2 may be provided to one of inputs of the logic gates. The gate control signals S_GC1 and S_GC2 may be provided from outside of the input buffer 10 including each of the second buffer circuits 500c and 500d.

In the input buffer 10 according to example embodiments, the feedback circuit 300 connected to the output node N_B1 may be separated from the first inverter node N_INV1 included in the second buffer circuit 500c or 500d. If the feedback circuit 300 is separated from the first inverter node N_INV1, the voltage of the first inverter node N_INV1 may not be decreased by the feedback inverter included in the feedback circuit 300. In a case where the voltage of the first inverter node N_INV1 is decreased, the error between the input signal S_IN and the buffer output signal S_BO may be generated by the duty distortion generated in the outputs of the inverters included in the second buffer circuit 500c or 500d. If the input buffer 10 according to example embodiments is used, because the voltage of the first inverter node N_INV1 is not decreased by the feedback inverter included in the feedback circuit 300, the input buffer 10 may be operated at high speed.

Figure 22:
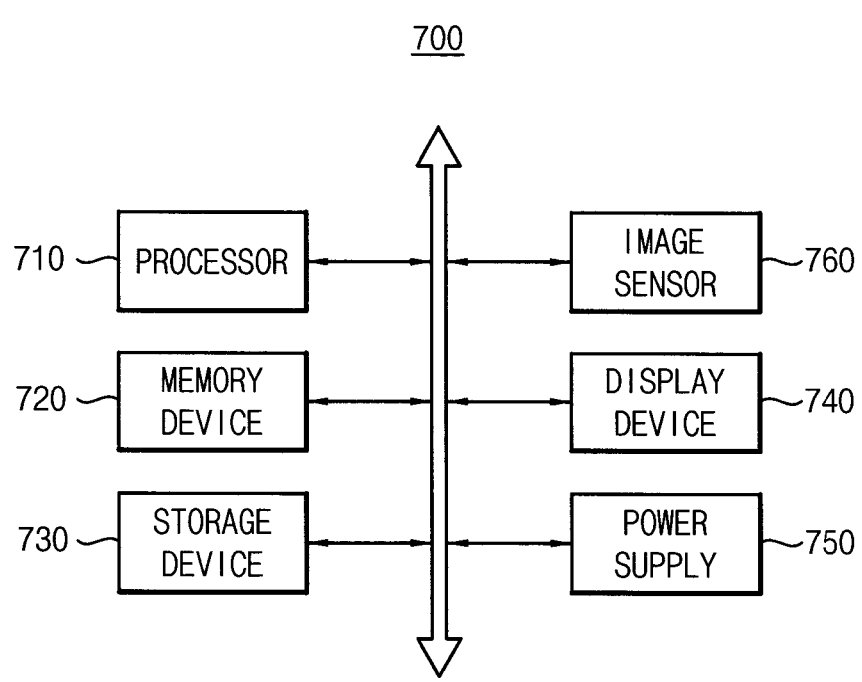
FIG. 22 is a block diagram illustrating a computing system including a memory system according to example embodiments.

FIG. 22 is a block diagram illustrating a computing system including a memory system according to example embodiments.

Referring to FIG. 22, a computing system 700 may include a processor 710, a memory device 720, a storage device 730, a display device 740, a power supply 750 and an image sensor 760. The computing system 700 may further include ports that communicate with a video card, a sound card, a memory card, a USB device, other electronic devices, etc.

The processor 710 may perform various calculations or tasks. According to embodiments, the processor 710 may be a microprocessor or a CPU. The processor 710 may communicate with the memory device 720, the storage device 730, and the display device 740 via an address bus, a control bus, and/or a data bus. In some embodiments, the processor 710 may be coupled to an extended bus, such as a peripheral component interconnection (PCI) bus. The memory device 720 may store data for operating the computing system 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 includes an input buffer according to the example embodiments disclosed above. The storage device 730 may include a solid state drive (SSD), a hard disk drive (HDD), a CD-ROM, etc. The computing system 700 may further include an input device such as a touchscreen, a keyboard, a keypad, a mouse, etc., and an output device such as a printer, a display device, etc. The power supply 750 supplies operation voltages for the computing system 700. In addition, in an embodiment of the present disclosure, a three dimensional (3D) memory array is provided in the memory device 720. The 3D memory array is monolithically formed in one or more physical levels of arrays of memory cells having an active area disposed above a substrate (e.g., a silicon substrate) and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word lines and/or bit lines shared between levels: U.S. Pat. Nos. 7,679,133; 8,553,466; 8,654,587; and 8,559,235 and U.S. Pat. Pub. No. 2011/0233648.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the computing system 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The computing system 700 may be a digital camera, a mobile phone, a smart phone, a portable multimedia player (PMP), a personal digital assistant (PDA), a computer, etc.

In a case where the memory device 720 is implemented using a cache memory based on the bloom-filter according to example embodiments, the space of repair cells included in the memory device may be efficiently decreased.

Figure 23:
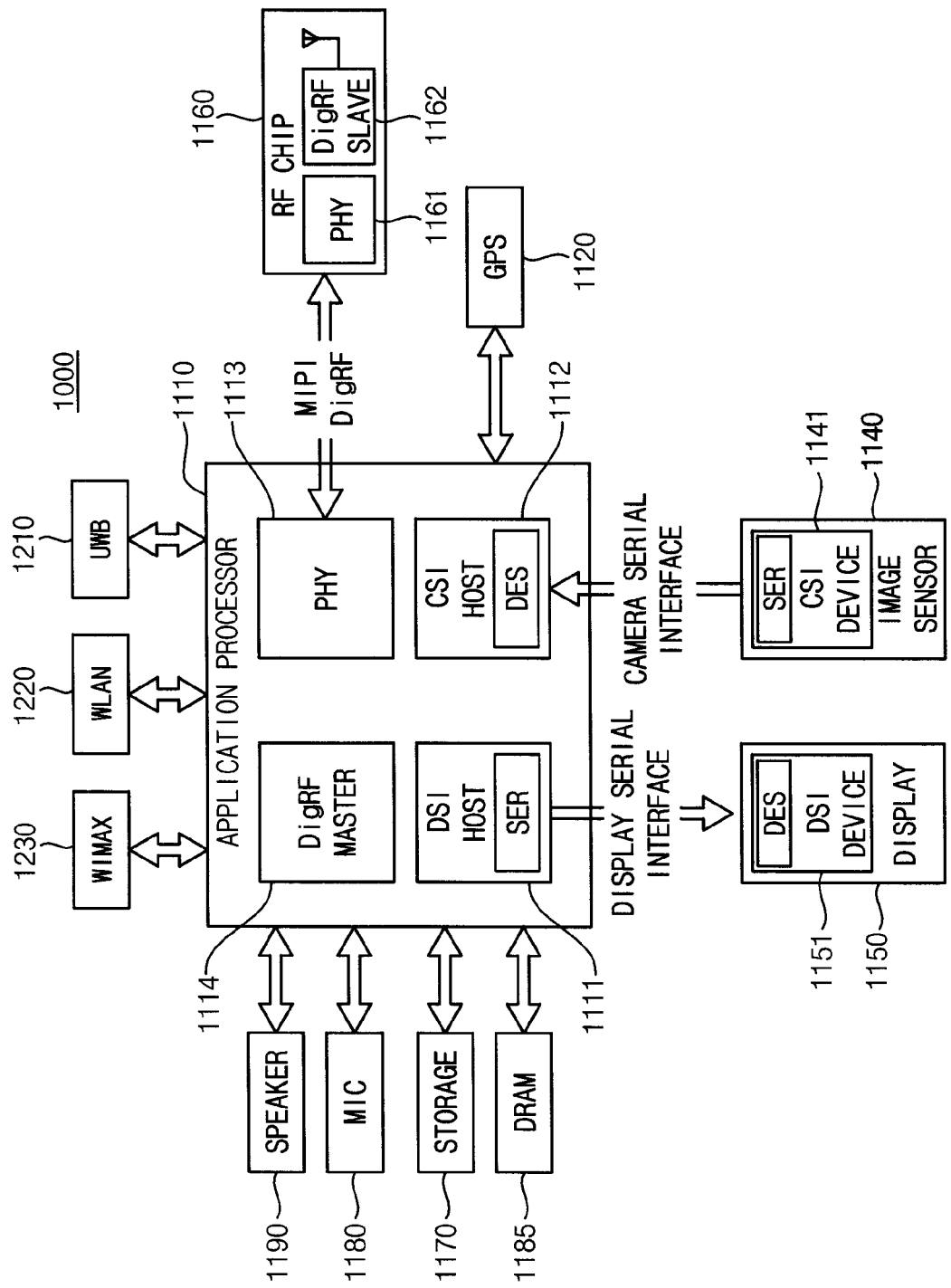
FIG. 23 is a block diagram illustrating an example of an interface used in the computing system of FIG. 22 according to an embodiment.

FIG. 23 is a block diagram illustrating an example of an interface used in the computing system of FIG. 22 according to an embodiment.

Referring to FIG. 23, a computing system 1000 may be implemented by a data processing device that uses or supports a mobile industry processor interface (MIPI) interface. The computing system 1000 may include an application processor 1110, an image sensor 1140, a display device 1150, etc. The display device 1150 may include the source driver according to example embodiments as described with reference to FIGS. 10 and 11. A CSI host 1112 of the application processor 1110 may perform a serial communication with a CSI device 1141 of the image sensor 1140 via a camera serial interface (CSI). In some embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In some embodiments, the DSI host 1111 may include a serializer (SER), and the DSI device 1151 may include a deserializer (DES). The computing system 1000 may further include a radio frequency (RF) chip 1160 performing a communication with the application processor 1110. A physical layer (PHY) 1113 of the computing system 1000 and a physical layer (PHY) 1161 of the RF chip 1160 may perform data communications based on a MIPI DigRF. The application processor 1110 may further include a DigRF MASTER 1114 that controls the data communications of the PHY 1161.

The computing system 1000 may further include a global positioning system (GPS) 1120, a storage 1170, a MIC 1180, a DRAM device 1185, and a speaker 1190. In addition, the computing system 1000 may perform communications using an ultra wideband (UWB) 1120, a wireless local area network (WLAN) 1220, a worldwide interoperability for microwave access (WIMAX) 1130, etc. Other structures and interfaces of the computing system 1000 may also be used. In one embodiment, the DRAM device 1185 or at least one item of the computing system 1000 may include the input buffer described above.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages described herein. Accordingly, all such modifications are intended to be included within the scope of inventive concepts as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An input buffer comprising:
   a first buffer configured to output an amplification signal to an output node of the first buffer based on a first input signal;
   a feedback circuit connected to the output node of the first buffer, and configured to control the amplification signal; and
   a second buffer circuit configured to output a buffer output signal by buffering the amplification signal,
   wherein the feedback circuit comprises:
      a feedback resistor configured to receive the amplification signal from the output node of the first buffer and provide a feedback signal to a feedback node; and
      a feedback inverter connected between the feedback node and the output node of the first buffer, and configured to control the amplification signal based on the feedback signal, and
   wherein the output node of the first buffer and an output node of the feedback inverter are commonly connected.

2. The input buffer of claim 1, wherein the feedback resistor includes a variable resistor, and
   wherein a resistance of the variable resistor is adjustable.

3. The input buffer of claim 2, wherein the variable resistor includes:

a plurality of resistors connected in series or parallel; and
a plurality of resistor switches,
wherein when the plurality of resistors are connected in series, each of the plurality resistor switches is connected to a respective resistor in parallel, and
wherein when the plurality of resistors are connected in parallel, each of the plurality of resistor switches is connected to a respective resistor in series.

4. The input buffer of claim 3, wherein a logic threshold voltage of the feedback inverter is adjustable.

5. The input buffer of claim 4, wherein the logic threshold voltage of the feedback inverter is substantially equal to a logic threshold voltage of a first inverter included in the second buffer circuit.

6. The input buffer of claim 4, wherein the feedback inverter includes:
a plurality of P-MOS transistors connected to a power supply voltage;
a plurality of N-MOS transistors connected to a ground voltage; and
a plurality of transistor switches connecting each of the plurality of P-MOS transistors and the plurality of N-MOS transistors to the output node of the first buffer.

7. The input buffer of claim 6, wherein the plurality of transistor switches are independently controlled based on respective control signals provided from outside of the input buffer.

8. The input buffer of claim 7, wherein the logic threshold voltage of the feedback inverter is adjustable by controlling each of the plurality of P-MOS transistors and the plurality of N-MOS transistors based on the control signals.

9. The input buffer of claim 6, wherein the first buffer is turned on or turned off based on an enable signal provided from outside of the input buffer.

10. The input buffer of claim 9, wherein, when the first buffer is turned off based on the enable signal, either the plurality of resistor switches or the plurality of transistor switches are configured to electrically isolate the output node from the feedback node.

11. The input buffer of claim 9,
wherein the feedback circuit further comprises a feedback switch connected between the feedback resistor and the feedback inverter, and
wherein, when the first buffer is turned off based on the enable signal, the feedback switch is turned off.

12. The input buffer of claim 11, wherein the first buffer is configured to output the amplification signal to the output node of the first buffer based on additional a second input signal having an opposite phase of the first input signal.

13. A memory device comprising:
an input buffer configured to output a buffer output signal based on an input signal; and
a memory cell array configured to store data corresponding to the buffer output signal,
wherein the input buffer comprises:
a first buffer configured to output an amplification signal to an output node of the first buffer based on the input signal;
a feedback circuit connected to the output node of the first buffer, and configured to control the amplification signal; and
a second buffer circuit configured to output the buffer output signal by buffering the amplification signal,
wherein the feedback circuit comprises:
a feedback resistor configured to receive the amplification signal from the output node of the first buffer and provide a feedback signal to a feedback node; and
a feedback inverter connected between the feedback node and the output node of the first buffer, and configured to control the amplification signal based on the feedback signal,
wherein an input node of the feedback inverter is the same as the feedback node, and
wherein the memory cell array includes a three-dimensional memory array in which word lines and/or bit lines are shared between levels.

14. A circuit for a semiconductor device, the circuit comprising:
a first buffer including a first input node and an output node, and configured to output a first output signal on the output node in response to a first input signal on the first input node;
a second buffer including an input node and an output node, and configured to output a second output signal on the output node of the second buffer in response to the first output signal;
a resistor including a first end connected to the output node of the first buffer and a second end connected to the input node of the second buffer; and
a third buffer including an input node and an output node, and configured to output a third output signal on the output node of the third buffer in response to the first and second output signals.

15. The circuit of claim 14, wherein the first buffer further includes a second input node, and is configured to output the first output signal on the output node of the first buffer in response to a second input signal on the second input node, and
wherein a phase of the second input signal is opposite to a phase of the first input signal.

16. The circuit of claim 14, wherein a driving capability of the first buffer is greater than a driving capability of the second buffer.

17. The circuit of claim 14, wherein the third buffer includes either only one or more inverters, or one or more inverters and a NAND gate or a NOR gate.

18. The circuit of claim 14, wherein a logic threshold voltage of the second buffer is substantially the same as a logic threshold voltage of the third buffer.

19. The circuit of claim 14, wherein the output node of the first buffer, the output node of the second buffer, and the input node of the third buffer are the same node.

20. The circuit of claim 14, further comprising:
a switch connected between the resistor and the second buffer, and configured to electrically isolate the resistor from the second buffer.

* * * * *